United States Patent [19]

Weng et al.

[11] Patent Number: 4,847,705

[45] Date of Patent: Jul. 11, 1989

[54] METHOD AND APPARATUS FOR ENCODING MAGNETIC DISK SECTOR ADDRESSES

[75] Inventors: Lih-Jyh Weng, Lexington; Bernardo Rub, Shrewsburg, both of Mass.

[73] Assignee: Digital Equipment Corporation, Maynard, Mass.

[21] Appl. No.: 70,689

[22] Filed: Jul. 7, 1987

[51] Int. Cl.$^4$ .................. G11B 20/18; G11B 20/10
[52] U.S. Cl. ................................... 360/49; 360/72.2
[58] Field of Search .................... 360/49, 72.2; 371/38

[56] References Cited
U.S. PATENT DOCUMENTS 4,413,339 11/1983 Riggle ............................ 371/38

Primary Examiner—A. J. Heinz
Attorney, Agent, or Firm—Nutter, McClennen & Fish

[57] ABSTRACT

The invention encodes magnetic disk sector addresses using a large distance, "d", Reed-Solomon code to produce code words which vary by at least "d" symbols for any two different encoded addresss. The result of the encoding is a set of redundancy symbols, which are usually associated with error correction. These symbols are appended to the address symbols to produce address code words. An address code word read from a disk can contain up to $(d-1)/2$ errors and still be identified as the correct sector address. To protect the encoded sector address from synchronization errors the address code words are further encoded by adding them to a coset leader to produce header code words. The header code words are then recorded in the address portions of the sectors. When a header code word is read from a sector, the coset leader is subtracted from the header code word to produce an address code word. The address code word is then compared with the address code word for the specified address. If there is a synchronization error, the comparison of the resulting address code word with the address code word for the specified address will result in a difference of more than $(d-1)/2$ symbols and the sector will not be treated as the specified address.

18 Claims, 4 Drawing Sheets

METHOD AND APPARATUS FOR ENCODING MAGNETIC DISK SECTOR ADDRESSES

FIELD OF INVENTION

This invention relates to computer systems in general and more particularly to methods for locating stored data on a magnetic disk.

DESCRIPTION OF THE PRIOR ART

Computer systems often use peripheral storage devices, such as magnetic disks, to store data. The data is stored on the disks in circular tracks. Each track is divided into a number of sectors usually consisting of either 512 or 576 bytes, that is, eight-bit symbols. Each sector, in turn, consists of two sections, an address section and a data section. The sector is uniquely identified by address symbols which are stored in the address section of the sector when the disk is formatted.

The disk drive has a read/write head which must be over a sector to perform a storage or retrieval ("write" or "read") operation in the sector. Thus the address of the sector rotating under the head is read and a determination is made whether or not the sector is the correct sector. This must be done in the time it takes the address portion of the sector to rotate under the read/write head. That is, if the drive is to perform a read or write operation in the sector, it must be ready to do so when the data portion of the sector, which closely follows the address portion, rotates under the head.

In order to determine if a sector is the correct sector, the drive reads the sector address and then compares it with the specified address of the sector in which data is to be read or written. If the addresses match, the data will be read from or written to the sector.

If an address read from a sector has errors in it, the sector may be mistakenly identified as another sector. Thus the disk drive may determine that the head is located over sector 100 when it is actually located over sector 101, and the read or write operation that is to occur at sector 100 will be performed on the wrong sector. If a sector address contains several errors or the address is corrupted due to a medium defect or soft error in the disk, the sector address may be unreadable. Thus the sector cannot be identified and it is unusable.

In order to avoid misinterpreting the address of a sector, the sector addresses must be written on the disk in such a way that even with a number of errors in the address, it will neither be read as the address of a different sector nor be rendered unidentifiable.

In a prior method for coping with errors in a sector address, the address is recorded several times in succession. The specified sector address is compared with each copy of the address stored in the sector, and if some minimum number of stored addresses match the specified address the sector is determined to be the correct sector. Thus, if one of the copies of the address contains an error, the sector will still be identifiable.

The arrangement is feasible only if the system error rate is fairly low. Otherwise, the number of copies of the address that will be required in each sector to ensure some minimum number of error-free copies with a reasonable degree of certainty will be prohibitive due to the amount of storage space the addresses will occupy.

Another problem that can occur in reading a sector address is that the system can momentarily lose synchronization between sector and thereby fail to sense correctly the beginning of an address section of a sector. It may therefore sense the wrong bits in reading the sector address. If this occurs, data may be read from or written to the wrong sector.

The use of multiple copies of the sector address does not prevent the drive from identifying the wrong sector due to mis-synchronization. If the disk drive interprets a data symbol one or two bits "off" as a correct sector address, the next few copies of the address will also be incorrectly interpreted and the wrong sector can be identified. If the data is then written to the wrong sector, any data previously recorded in the sector is written over and thus lost. The data that is newly written to the wrong sector is also lost because it cannot later be retrieved at the appropriate address.

Thus mistakes in interpreting the sector addresses, due either to errors in the recorded sector addresses or mis-synchronizaion of the read/write head, can be costly in terms of lost data and/or lost time.

SUMMARY OF THE INVENTION

In accordance with the invention, the sector addresses, which are typically represented by six data symbols, are encoded over a Galois Field $GF(2^p)$ using a large distance, "d", Reed-Solomon code, that is, a code that will encode the sector addresses to produce code words which vary by at least d symbols for any two different encoded addresses. Specifically, the result of the encoding is a set of redundancy symbols, which are usually associated with error correction. The redundancy symbols are appended to the address symbols to produce address code words. Just as each sector address is unique, that is, identifies only one sector, each address code word is unique. The advantage of encoding the sector address is that each address code word differs from any other address code word by at least d symbols. Thus an address code word read from the disk can contain up to $(d-1)/2$ errors and still be identified as the correct sector address because it most closely resembles only one address code word.

If a head is not synchronized correctly with the address section of the sector, the address code word can be misinterpreted. That is, the portion of the address code word read from the address portion of the sector will be concatenated with the appropriate number of bits preceding the address code word or following the address code word, depending on how the head is mis-synchronized, and the resulting string of bits will be interpreted as an address code word. The result may be that the sector is incorrectly identified. In order to prevent this, the address code words are further encoded by adding them to a coset leader to produce header code words. The coset leader is a code word of a super-code of the Reed-Solomon code, that is, the generator polynomial for the code containing the coset leader is a factor of the generator polynomial for the Reed-Solomon code, but the coset leader is not a code word of the Reed-Solomon code itself.

The header code words are then recorded in the address portions of the sectors. When a header code word is read from a sector, the coset leader is subtracted from the header code word to produce an address code word. If the head is synchronized incorrectly with the address portion of a sector, the comparison of the resulting address code word with the address code word for the specified address will always result in more than $(d-1)/2$ symbols which differ between the two code words and the sector will not be treated as the specified address.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION

It should be understood that all addition, subtraction and multiplication operations performed during the encoding and comparison processes are Galois Field operations and the Galois Fields are of the form $GF(2^p)$.

Figure 1:
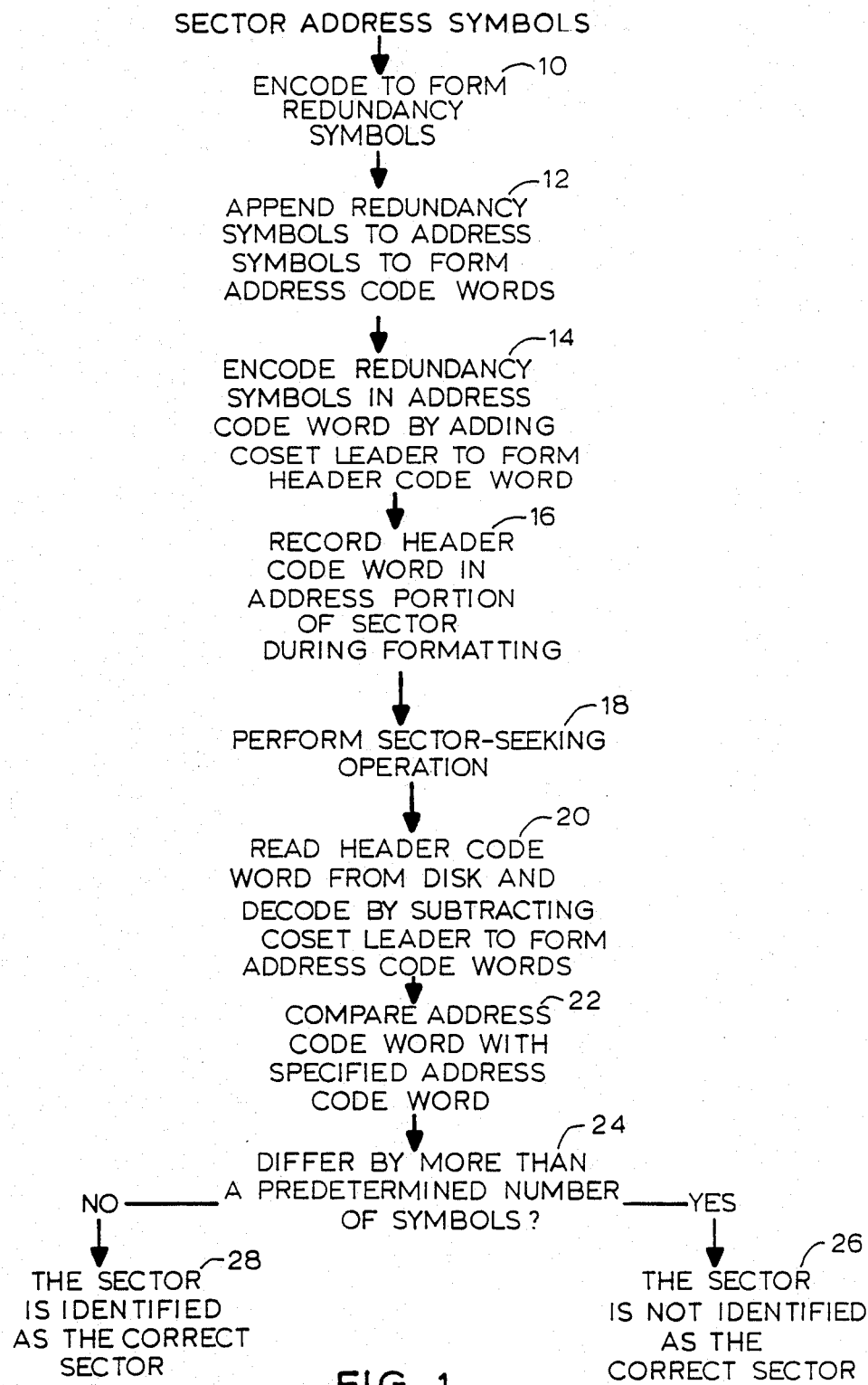
FIG. 1 is a flow chart of the steps involved in the operation of the preferred embodiment.

With reference to FIG. 1, a sector address in an exemplary system is encoded over a Galois Field $GF(2^5)$ to produce redundancy symbols (step 10), using the generator polynomial $$g(x)=(x+\alpha^{-12})*(x+\alpha^{-11})*(x+\alpha^{-10})* \ldots *(x+\alpha^{10})*(x++^{11})*(x+\alpha^{12})$$

where $\alpha$ is the primitive element of the field and the field is based on the primitive polynomial $p(x)=x^5+x^2+1$.

Thus the generator polynomial is $$x^{25}+\alpha^{22}x^{24}+\alpha^{21}x^{23}+\alpha^{25}x^{22}+\alpha^{13}x^{21}+\alpha^{28}x^{20}+\alpha^2x^{19} \\ +\alpha^{16}x^{18}+\alpha^{23}x^{17}+\alpha^2x^{16}+\alpha^4x^{15}+\alpha^7x^{14}+\alpha^{27}x^{13}+\alpha^{27}x^{12} \\ +\alpha^7x^{11}+\alpha^4x^{10}+\alpha^2x^9+\alpha^{23}x^8+\alpha^{16}x^7+\alpha^2x^6+\alpha^{28}x^5+\alpha^{13}x^4 \\ +\alpha^{25}x^3+\alpha^{21}x^2+\alpha^{22}x+\alpha^0$$

The redundancy symbols are then appended to the sector address to form address code words (step 12).

This generator polynomial is a distance twenty-six Reed-Solomon code generator polynomial that can correct up to twelve errors. The distance of a Reed-Solomon code is the minimum number of symbols that are dissimilar between any two code words. If two code words generated by a distance twenty-six Reed-Solomon code are compared, at least twenty-six of the symbols in the code words will not be the same. A code word in a distance twenty-six code and containing twelve or fewer errors can therefore be identified as the correct code word. The code word can be so identified because, with twelve or fewer errors, it is "closest" to, that is, has the largest number of symbols the same as, the correct code word.

In the present system, this principle is applied to the sector-seeking operation by comparing, symbol by symbol, the address code word read from the disk with the address code word for a specified address (steps 18–22). If the two code words differ in twelve $[(d-1)/2]$ or fewer symbols, the sector is the specified sector; otherwise, it is determined not to be the specified sector (steps 24–28). Comparing the sector address code word with a specified address code word to determine the number of symbols that differ is much faster than conventional decoding and error correction techniques. Thus, using the comparison method, sector identification can be completed in time to perform a read or write operation in the data section of the sector if the sector is identified as the correct sector.

Encoding the sector addresses into address code words does not necessarily prevent an address from being misinterpreted if the head is mis-synchronized with the address portion of a sector. If the head is mis-synchronized with a sector address code by some number, m, bits, the portion of the address code read from the sector is concatenated with m bits immediately preceding or following the address code, depending on how the head is mis-synchronized. This may result in an address code for one of the other sectors. Thus the sector could be incorrectly identified as the sector specified for a read or write operation.

To avoid the mis-identification because of mis-synchronization, the redundancy symbols are further encoded by adding them to a coset leader to produce another set of redundancy symbols (step 14). The coset leader chosen is a code word of a super-code of the Reed-Solomon code. The coset leader chosen depends on the primitive polynomial used to generate the Galois Field. In the example described herein, the coset leader, $\beta$, is $$x^{24}+\alpha^{30}x^{23}+\alpha^1x^{22}+\alpha^{12}x^{21}+\alpha^{21}x^{20}+\alpha^4x^{19} \\ +\alpha^{10}x^{18}+\alpha^3x^{17}+\alpha^3x^{16}+\alpha^{10}x^{15}+\alpha^4x^{14}+\alpha^{21}x^{13}+\alpha^{12}x^{12}+\alpha^1x^{11} \\ +\alpha^{30}x^{10}+x^9$$

The coset leader is added to the redundancy symbols in the sector address code word. Thus the sector address symbols are not affected. Considering all possible address code words as a group, adding the coset leader to the redundancy symbols in the code word, in effect, shifts the entire group by an amount $\beta$. When the coset leader is later subtracted from the redundancy symbols, the code words are are shifted back by the same amount $\beta$ to the original address code words. If, however, a code word is misread due to a mis-synchronization of the head, the result of subtracting the coset leader from the redundancy symbols will in no case result in the address code word for the specified sector.

The new set of redundancy symbols resulting from coset leader addition are appended to the sector address to form header code words (step 14). These header code words are written in the address portion of the sectors during the formatting of the disk (step 16). When a disk drive is to perform a read or write operation in a particular sector, the specified address of the sector is encoded to form an address code word as described above. The header code word of the sector rotating under the read/write head is read and the coset leader is subtracted, that is, it is again exclusive OR'd with the header code word (step 20). The resulting sector address code word is then compared with the address code for the specified sector address as set forth above to ascertain whether or not the sector is the specified sector (steps 22–28). If the head is over the wrong sector, or if the head is over the right sector but is mis-synchronized with the address portion of the sector, the comparison will result in at least thirteen symbols which differ and the sector will not be identified as the specified sector. It will be appreciated by those skilled in the art that the same result may be achieved by adding the coset leader to the address code word for the specified address to form a specified header code word and then comparing comparing this header code word with the header code word read from the disk.

When the disk drive is powered-up, that is, when the drive is made available to perform read or write operations, the drive must accurately locate the position of the head relative to the disk before any read or write operations can be performed. Therefore the system must read the header code of the sector rotating under the head and correctly interpret the code. If there are errors in the header code word, the sector might be identified incorrectly. Thus the system must first determine if there are errors in the address portion of the header code word, and if there are errors it corrects them, if possible, by means of error correction techniques.

Preferably a technique known as permutation decoding is used to "decode" the sector address code word, that is, the header code word with the coset leader subtracted from it, to determine if there are any errors in the sector address and to correct them. Permutation decoding is an uncomplicated, fast error correction technique which is suitable for codes with high redundancy, i.e., codes which have a large number of redundancy symbols to correct a small number of errors. That is, permutation decoding corrects fewer errors for a given number of redundancy symbols than do other, more complicated error correction techniques. However, permutation decoding is preferred here because the address code words in fact contain a large number (e.g. twenty-five) redundancy symbols for the sector-seeking operation, as described above. There are thirty-one symbols in an address code word, six address symbols and twenty-five redundancy symbols; up to five erroneous symbols, which is a relatively large fraction of the code word symbols, can be corrected using permutation decoding.

Figure 2A:
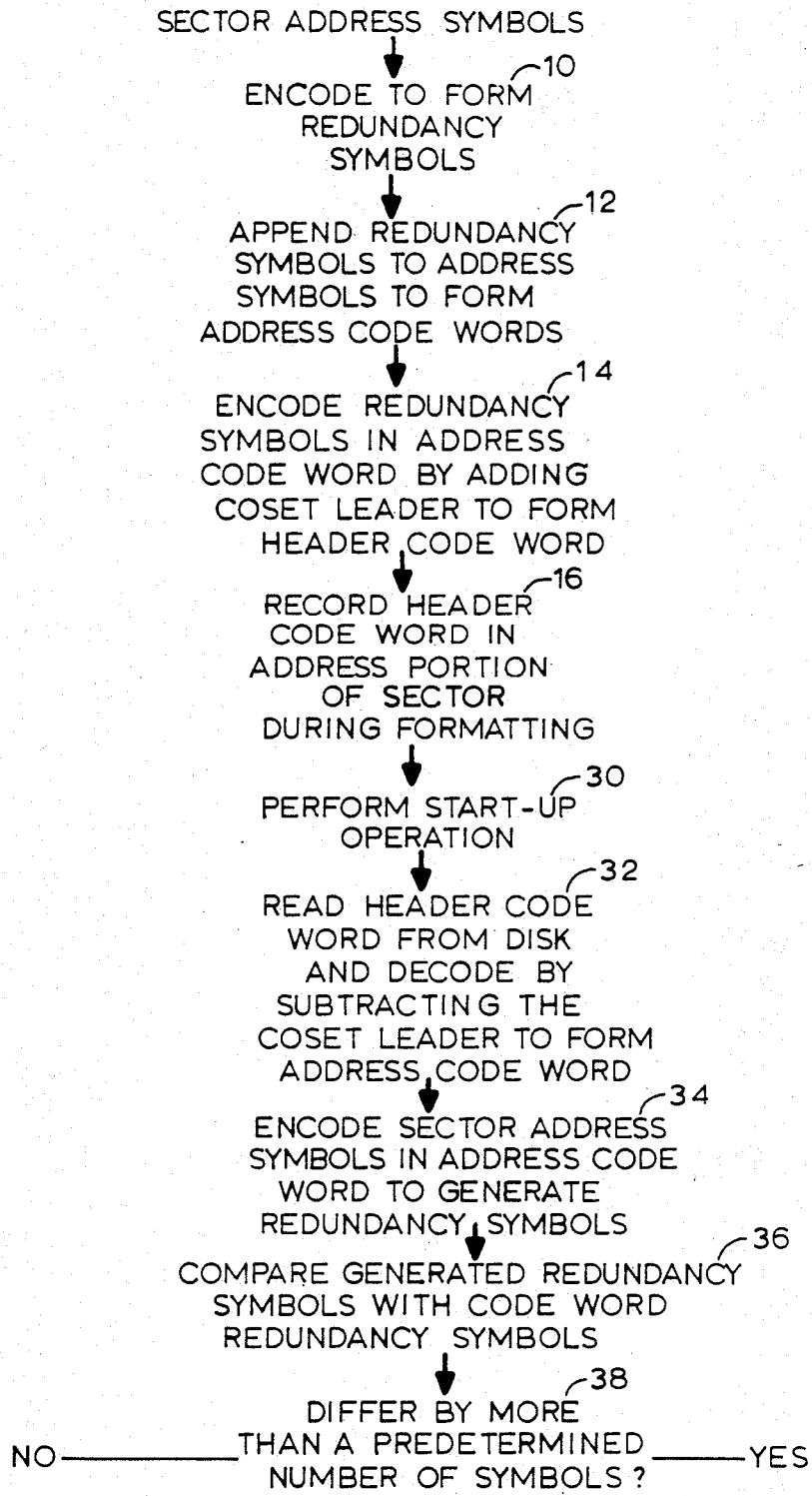
FIGS. 2A and 2B are a flow chart of the steps involved in the start-up operation of the preferred embodiment.
Figure 2B:
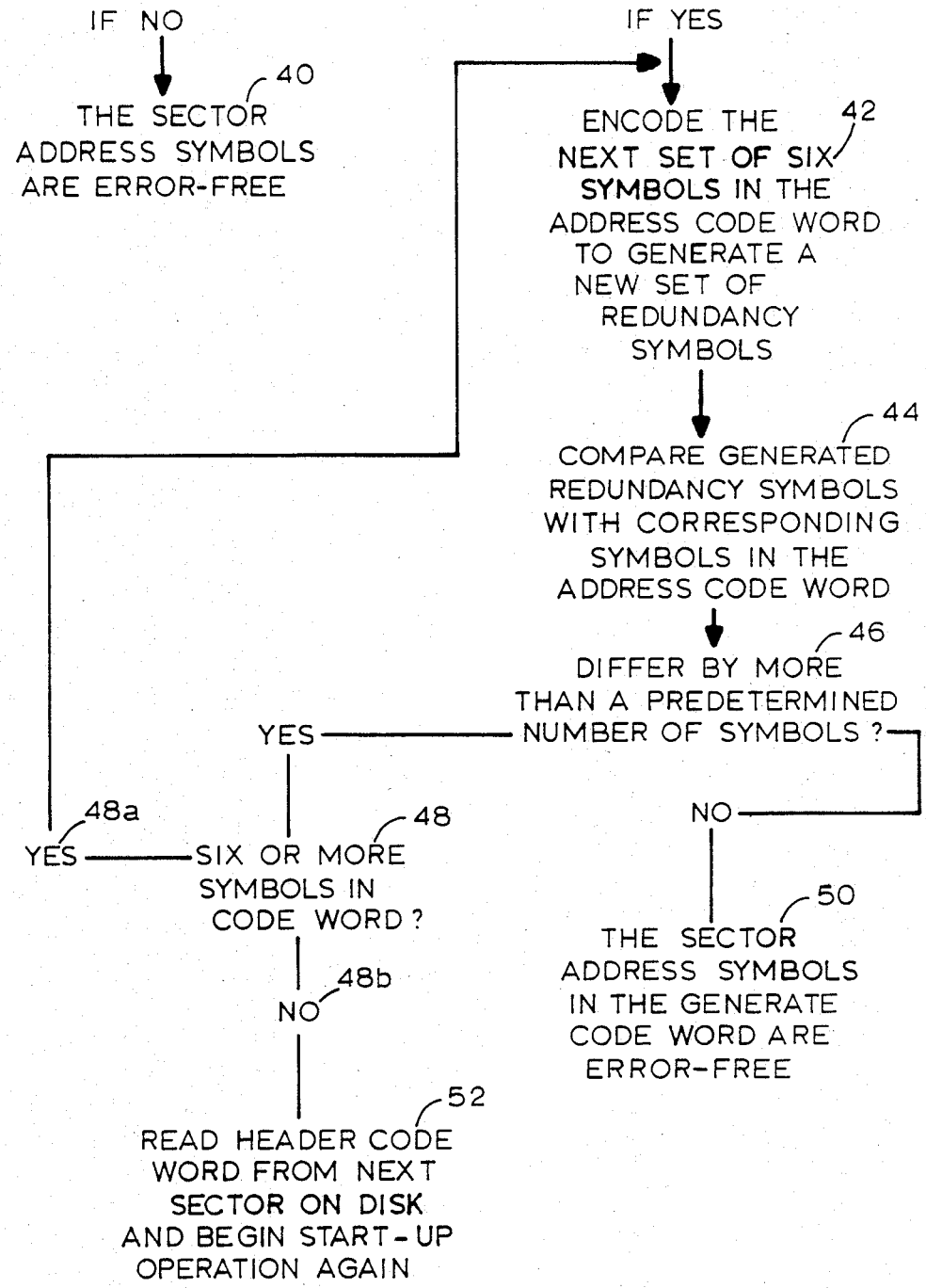
Figure 3:
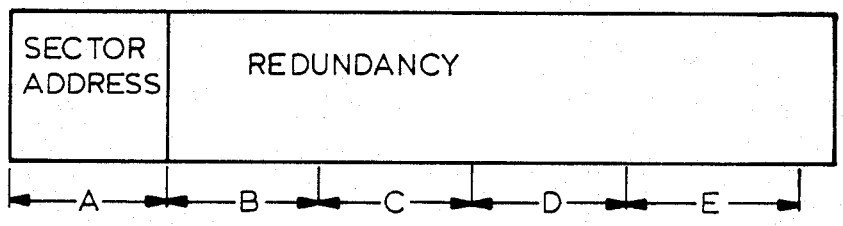
FIG. 3 is an illustration of the address section of a sector.

The method of permutation used in this exemplary system is a variation of standard permutation decoding. Although this method corrects fewer errors then standard permutation decoding, it is faster than the standard method. Referring to FIG. 3, a sector header code word is first read from the disk and the coset leader is subtracted from it, resulting in the corresponding address code word (steps 30–32). Next, the six sector address symbols A (FIG. 2), are encoded with the generator polynomial to form the redundancy symbols (step 34). These redundancy symbols are then compared, that is, exclusive OR'd, with the redundancy symbols in the sector address code word (step 36). If the redundancy symbols differ by "t" or fewer symbols, where $1 \leq t \leq 12$ and t represents the number of errors the code is designed to correct, there are no errors in the sector address contained in the address code word as retrieved from the disk and the position of the head relative to the disk is thus known (steps 38–40).

The number "t" can have any value between one and twelve. However, the code can unconditionally correct only four or fewer errors using this error correction technique. If there are more than four errors, the code can correct them only if the errors are clustered such that at least six consecutive code word symbols are error-free.

If the redundancy symbols differ by more than t symbols, the next six symbols B in the sector address code word are encoded to form a set of redundancy symbols (steps 38, 42). These symbols are then compared with the corresponding symbols in the sector address code word (step 44). That is, the generated redundancy symbols are compared with symbols C, D, E and A (FIG. 3), where the redundancy symbols corresponding to A are at the low order end of the set of generated redundancy symbols. If the symbols differ by t or fewer symbols, the symbols in the set of generated redundancy symbols corresponding to the sector address symbols A are error-free (steps 46, 50) Thus these symbols are used as the correct sector address.

If this second comparison results in the symbols differing by more than t symbols, the process is repeated for each of the remaining sets of six symbols C, D, E in the sector address code word until a set of redundancy symbols with t or fewer errors is found (steps 48, 48a). If such a set is not found in the sector address code word, the process is repeated with header code words of successive sectors until a error-free sector address can be determined (steps 48b, 52).

We claim:

1. A method for locating data sectors on a magnetic disk during sector seeking operations comprising the steps of:
   A. encoding the addresses of the sectors to produce sector address code words;
   B. encoding said sector address code words to produce sector header code words;
   C. recording said sector header code words in the sectors during the formatting of the disk;
   D. reading said sector header code word from the sector rotating under the head and decoding said sector header code word to form said sector address code word;
   E. encoding the specified address of the sector to be located in the same manner of step A to produce a specified address code words;
   F. comparing said sector address code word read from a disk sector with said specified address code word;
   G. (1) if the comparison results in a number of symbols which differ between said address code word and said specified address code word which is less than a predetermined number, identifying the sector as the correct sector; or
   (2) if the comparison results in a number of symbols which differ which is greater than said predetermined number, not identifying the sector as the correct sector.

2. The method in claim 1 wherein said encoding step further includes encoding said sector addresses using a large distance, "D", Reed-Solomon code over Galois Field $GF(2^p)$ to produce redundancy symbols and appending said redundancy symbols to said sector address.

3. The method of claim 1 wherein said further encoding step includes encoding said address code words by adding, using Galois Field addition, an element, "$\beta$", of a super-code of said Reed-Solomon code to said redundancy symbols in said address code word.

4. The method of claim 1 wherein said comparison step further includes exclusive OR'ing said address code words and said specified address code words.

5. A method for locating data sectors on a magnetic disk during sector seeking operations comprising the steps of:
   A. encoding the addresses of the sectors to produce sector address code words;
   B. recording said sector address code words in the sectors during the formatting of the disk;
   C. encoding the specified address of the sector to be located in the same manner of step A to produce specified address code words;

D. comparing said sector address code word read from a disk sector with said specified address code word;

E. (1) if the comparison results in a number of symbols which differ between said address code word and said specified address code word which is less than a predetermined number, identifying the sector as the correct sector; or (2) if the comparison results in a number of symbols which differ which is greater than said predetermined number, not identifying the sector as the correct sector.

6. The method in claim 5 wherein said encoding step further includes encoding said sector addresses using a large distance, "D", Reed-Solomon code over Galois Field GF($2^P$) to produce redundancy symbols and appending said redundancy symbols to said sector address.

7. The method of claim 5 wherein said comparison step further includes exclusive OR'ing said sector address code words and said specified address code words.

8. A method for determining the position of a read/write head relative to the sectors on a magnetic disk comprising the steps of:

A. encoding the addresses of the sectors to produce sector address code words;

B. encoding said sector address code words to produce sector header code words;

C. recording said sector header code words in the sectors during the formatting of the disk;

D. reading said sector header code word from the sector rotating under the head and decoding said sector header code word to form said sector address code word;

E. encoding the address portion of the sector address code word to form generated redundancy symbols as in step A.

F. comparing said redundancy symbols in said sector address code word with said generated redundancy symbols;

G. (1) if the comparison results in a number of symbols which differ between said address code word and said specified address code word which is less than a predetermined number, the sector address is error free; or (2) if the comparison results in a number of symbols which differ which is greater than said predetermined number, encoding a next set of consecutive symbols in the sector address code word in the same manner as step A and comparing the generated redundancy symbols with the corresponding symbols in the sector address word, if the result of the comparison is that the two sets of redundancy symbols differ by fewer than a predetermined number of symbols, using the symbols in the set of generated redundancy symbols corresponding to the sector address symbols as the error-free sector address;

(3) repeating step G (2) for each set of consecutive symbols in the sector address code word until the error-free sector address is determined, or if an error-free sector address cannot be so determined, repeating steps G (1)–(2) and, if necessary, step G (3) using the sector header code words from successive sectors until an error-free sector address ca be determined.

9. A method for locating data sectors on a magnetic disk during sector seeking operations comprising the steps of:

A. encoding the addresses of the sectors to produce sector address code words;

B. encoding said sector address code words to produce sector header code words;

C. recording said sector header code words in the sectors during the formatting of the disk;

D. reading said sector header code word from the sector rotating under the head;

E. encoding the specified address of the sector to be located in the same manner as steps A and B to produce a specified address code word;

F. comparing said sector header code word read from a disk sector with said specified header code word;

G. (1) if the comparison results in a number of symbols which differ between said header code word and said specified header code word which is less than a predetermined number, identifying the sector as the correct sector; or (2) if the comparison results in a number of symbols which differ which is greater than said predetermined number, not identifying the sector as the correct sector.

10. An apparatus for locating data sectors on a magnetic disk during sector seeking operations comprising:

A. means for encoding the addresses of the sectors to produce sector address code words;

B. means for encoding said sector address code words to produce sector header code words;

C. means for recording said sector header code words in the sectors during the formatting of the disk;

D. means for reading said sector header code word from the sector rotating under the head and decoding said sector header code word to form said sector address code word;

E. means for encoding the specified address of the sector to be located in the same manner of step A to produce a specified address code words;

F. means for comparing said sector address code word read from a disk sector with said specified address code word;

G. (1) if the comparison results in a number of symbols which differ between said address code word and said specified address code word which is less than a predetermined number, means for identifying the sector as the correct sector; or (2) if the comparison results in a number of symbols which differ which is greater than said predetermined number, not identifying the sector as the correct sector.

11. The apparatus of claim 10 wherein said means for encoding further includes means for encoding said sector addresses using a large distance, "D", Reed-Solomon code over Galois Field GF($2^P$) to produce redundancy symbols and appending said redundancy symbols to said sector address to said redundancy symbols in said address code word.

12. The apparatus of claim 10 wherein said means for further encoding includes encoding said address code words by adding, using Galois Field addition, an element, "$\beta$", of a sub-code of said Reed-Solomon code.

13. The apparatus of claim 10 wherein said means for comparing further includes exclusive OR'ing said address code words and said specified address code words.

14. The apparatus of claim 13 wherein said means for comparing further includes exclusive OR'ing said sector address code words and said specified address code words.

15. The apparatus of claim 13 wherein said means for encoding further includes means for encoding said sector addresses using a large distance, 37 D", Reed-Solomon code over Galois Field $GF(2^p)$ to produce redundancy symbols and appending said redundancy symbols to said sector address.

16. An apparatus for locating data sectors on a magnetic disk during sector seeking operations comprising:
   A. means for encoding the addresses of the sectors to produce sector address code words;
   B. means for recording said sector address code words in the sectors during the formatting of the disk;
   C. means for encoding the specified address of the sector to be located in the same manner of part A to produce specified address code words;
   D. means for comparing said sector address code word read from a disk sector with said specified address code word;
   E. (1) if the comparison results in a number of symbols which differ between said address code word and said specified address code word which is less than a predetermined number, means for identifying the sector as the correct sector; or
   (2) if the comparison results in a number of symbols which differ which is greater than said predetermined number, not identifying the sector as the correct sector;

17. An apparatus for determining the position of a read/write head relative to the sectors on a magnetic disk comprising:
   A. means for encoding the addresses of the sectors to produce sector address code words;
   B. means for encoding said sector address code words to produce sector header code words;
   C. means for recording said sector header code words in the sectors during the formatting of the disk;
   D. means for reading said sector header code word from the sector rotating under the head and decoding said sector header code word to form said sector address code word;
   E. means for encoding the address portion of the sector address code word to form generated redundancy symbols as in part A.
   F. means for comparing the redundancy symbols in said sector address code word with said generated redundancy symbols;
   G. (1) if the comparison results in a number of symbols which differ between said address code word and said specified address code word which is less than a predetermined number, the sector address is error free; or
   (2) if the comparison results in a number of symbols which differ which is greater than said predetermined number, means for encoding a next set of consecutive symbols in the sector address code word in the same manner as part A and comparing the generated redundancy symbols with the corresponding symbols in the sector address word, and if the result is that the two sets of redundancy symbols differ by fewer than a predetermined number of symbols, using the symbols in the set of generated redundancy symbols corresponding to the sector address symbols as the error-free sector address;
   (3) repeating step G (2) for each set of consecutive symbols in the sector address code word until the error-free sector address is determined, or if an error-free sector address cannot be so determined, repeating steps G (1)–(2) and, if necessary, repeating step G (3) using the sector header code words from successive sectors until an error-free sector address can be determined.

18. A means for locating data sectors on a magnetic disk during sector seeking operations comprising:
   A. means for encoding the addresses of the sectors to produce sector address code words;
   B. means for encoding said sector address code words to produce sector header code words;
   C. means for recording said sector header code words in the sectors during the formatting of the disk;
   D. means for reading said sector header code word from the sector rotating under the head;
   E. means for encoding the specified address of the sector to be located in the same manner as steps A and B to produce a specified address code word;
   F. means for comparing said sector header code word read from a disk sector with said specified header code word;
   G. (1) if the comparison results in a number of symbols which differ between said header code word and said specified header code word which is less than a predetermined number, means for identifying the sector as the correct sector; or
   (2) if the comparison results in a number of symbols which differ which is greater than said predetermined number, not identifying the sector as the correct sector.

* * * * *